United States Patent [19]

Kowalski

[11] Patent Number: 5,191,498
[45] Date of Patent: Mar. 2, 1993

[54] SAFETY DECIVE FOR INTEGRATED CIRCUIT

[75] Inventor: Jacek Kowalski, Trets, France

[73] Assignee: Gemplus Card International, Gemenos, France

[21] Appl. No.: 467,903

[22] Filed: Jan. 22, 1990

[30] Foreign Application Priority Data

Jan. 27, 1989 [FR] France ................. 89 00998

[51] Int. Cl.$^5$ .......................................... H01L 27/04
[52] U.S. Cl. .......................................... 361/1; 361/56
[58] Field of Search ............... 361/91, 93, , 212, 111, 361/56, 57, 220; 307/296.2; 357/23.13

[56] References Cited

U.S. PATENT DOCUMENTS

| 4,811,155 | 3/1989 | Kuriyama | 361/56 |
| 4,829,350 | 5/1989 | Miller | 361/91 |
| 4,924,339 | 5/1990 | Astumi et al. | 361/56 |

FOREIGN PATENT DOCUMENTS 2533047  9/1983  France .
2589603  6/1986  France .

Primary Examiner—A. D. Pellinen
Assistant Examiner—Ronald W. Leja
Attorney, Agent, or Firm—Roland Plottel

[57] ABSTRACT

Phenomena of unwanted programming, caused by the substrate currents of an integrated circuit, are prevented by providing for a measurement of these currents and for a circuit invalidating the operation of the integrated circuit when the result of this measurement goes beyond a certain threshold. In a preferred way, the measurement of the substrate current is obtained by making a bipolar type transistor, the base region of which is formed precisely by this substrate, or by making a a field-effect type of transistor, the gate of which and one of the active regions of which are connected to the ground terminal of the circuit. But theses two connections are different. One of the connections is direct while the other is a connection subjected to the fluctuations in the potential of the substrate.

5 Claims, 4 Drawing Sheets

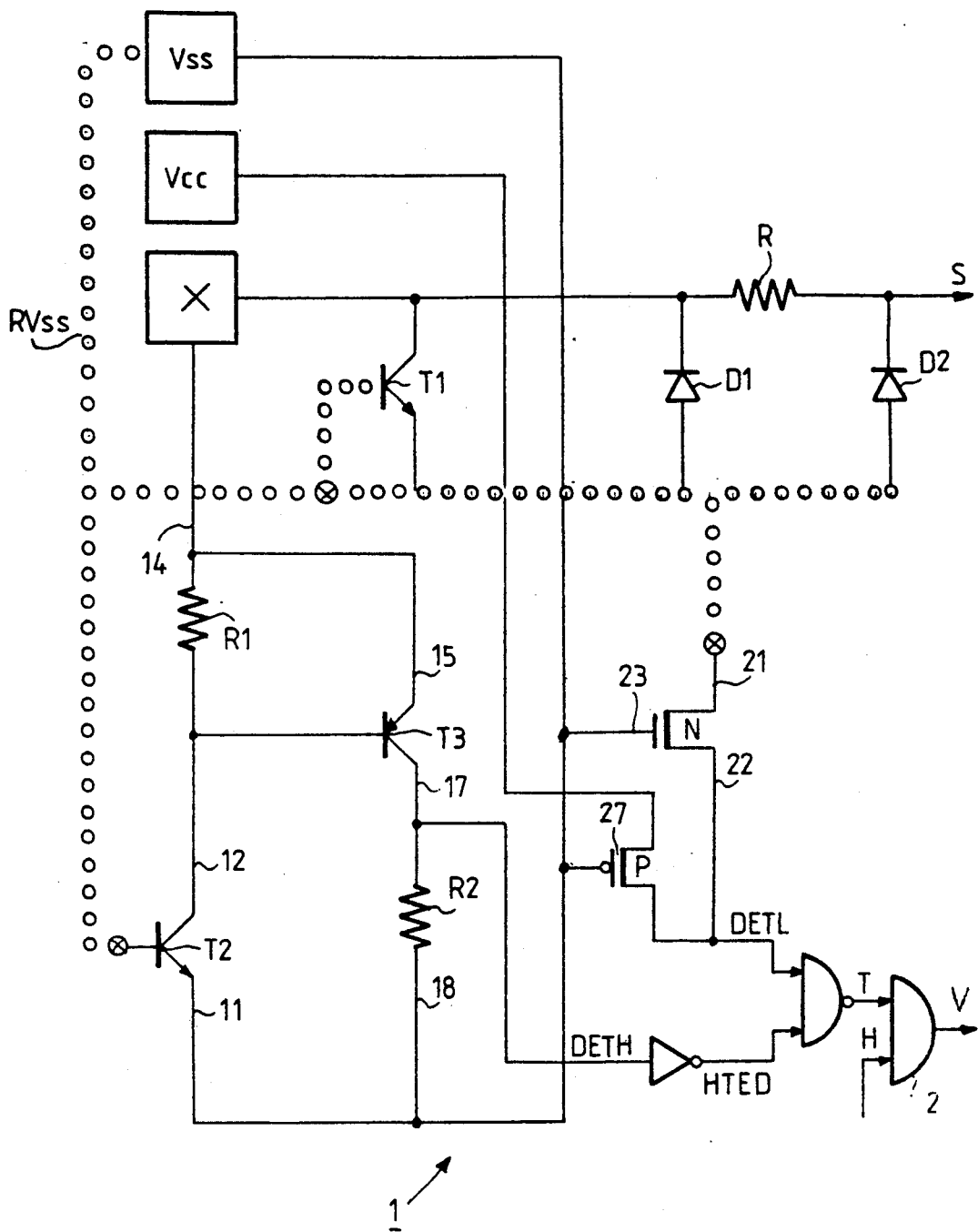
FIG_1

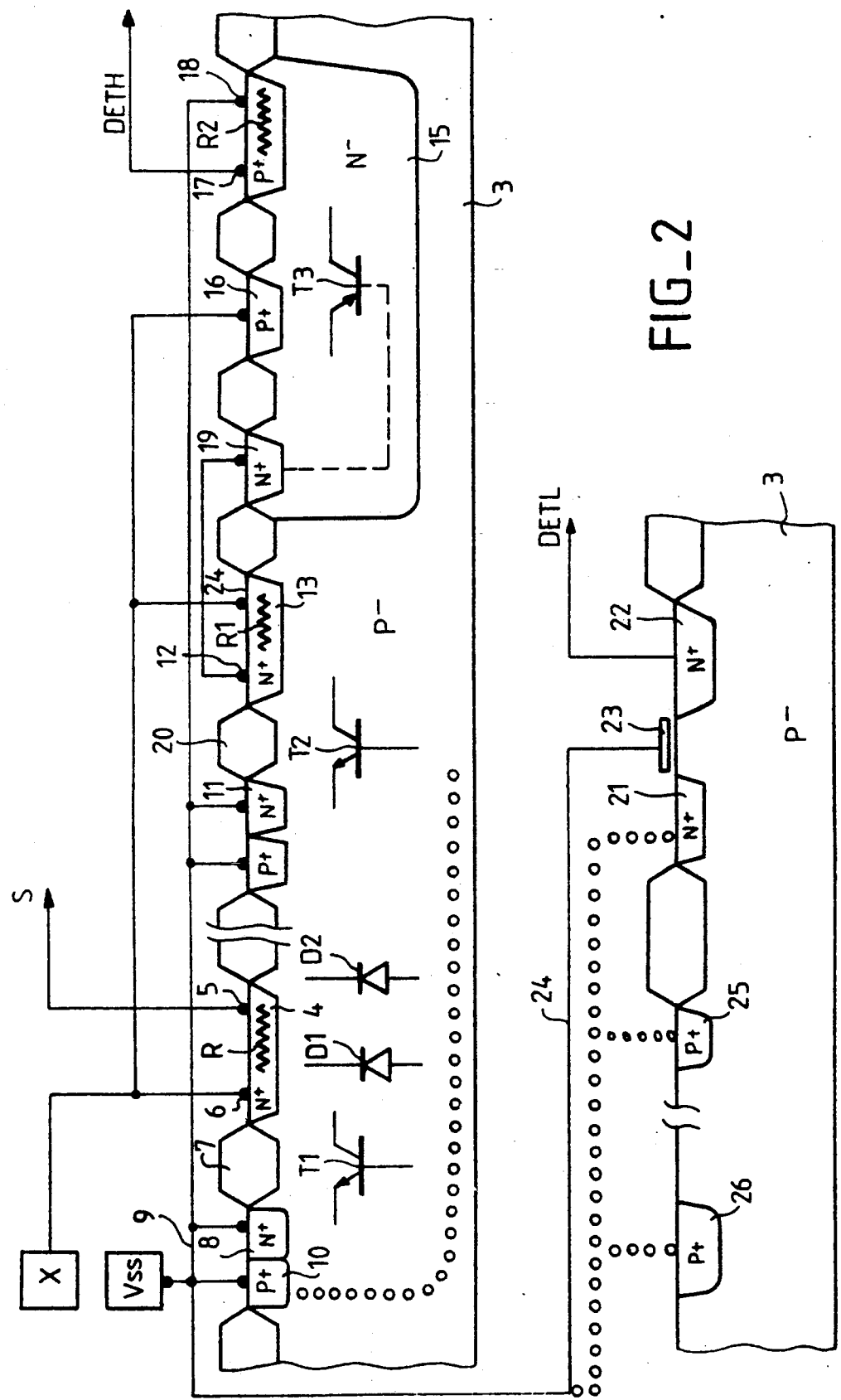
FIG_2

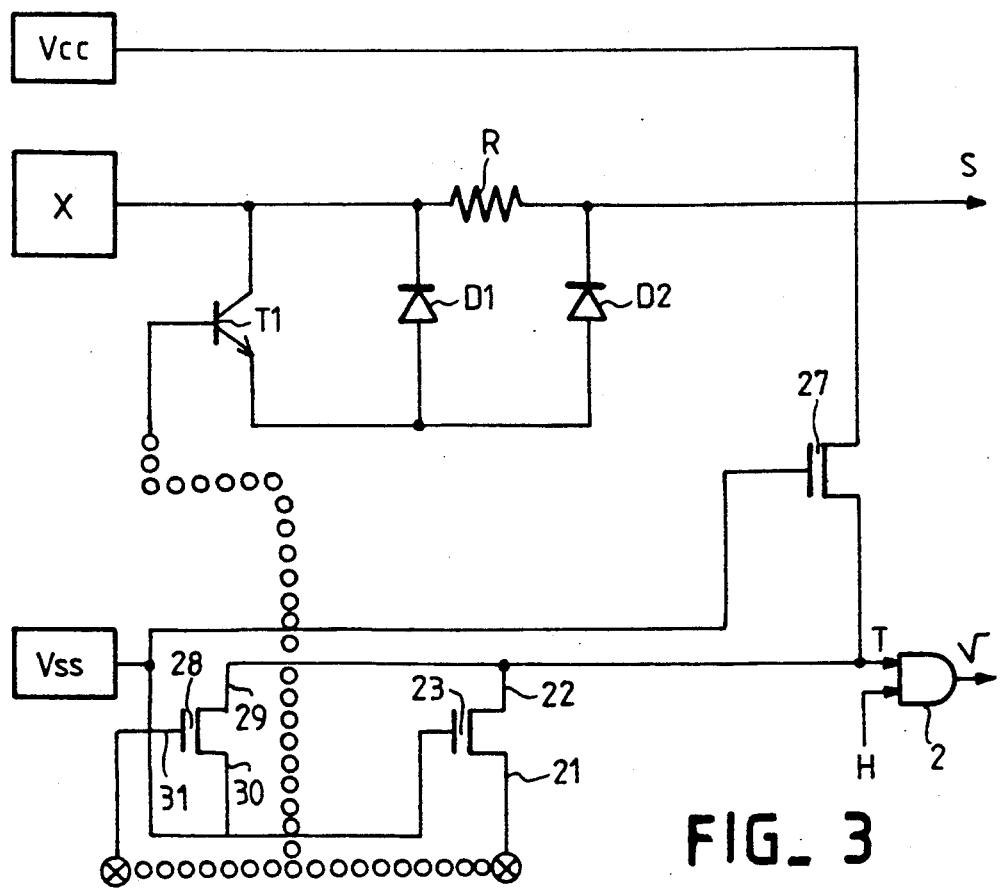
FIG_3
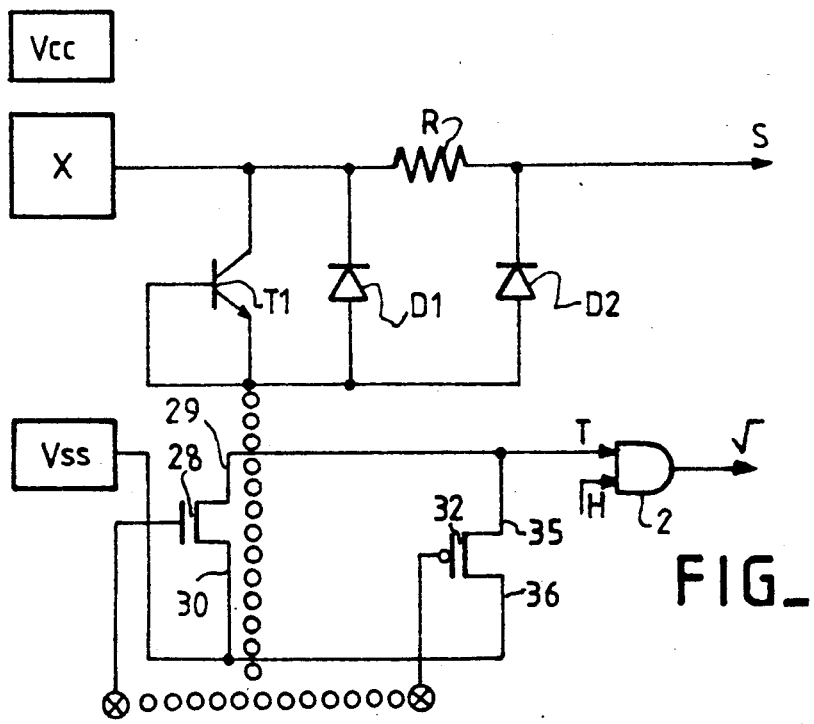
FIG_4

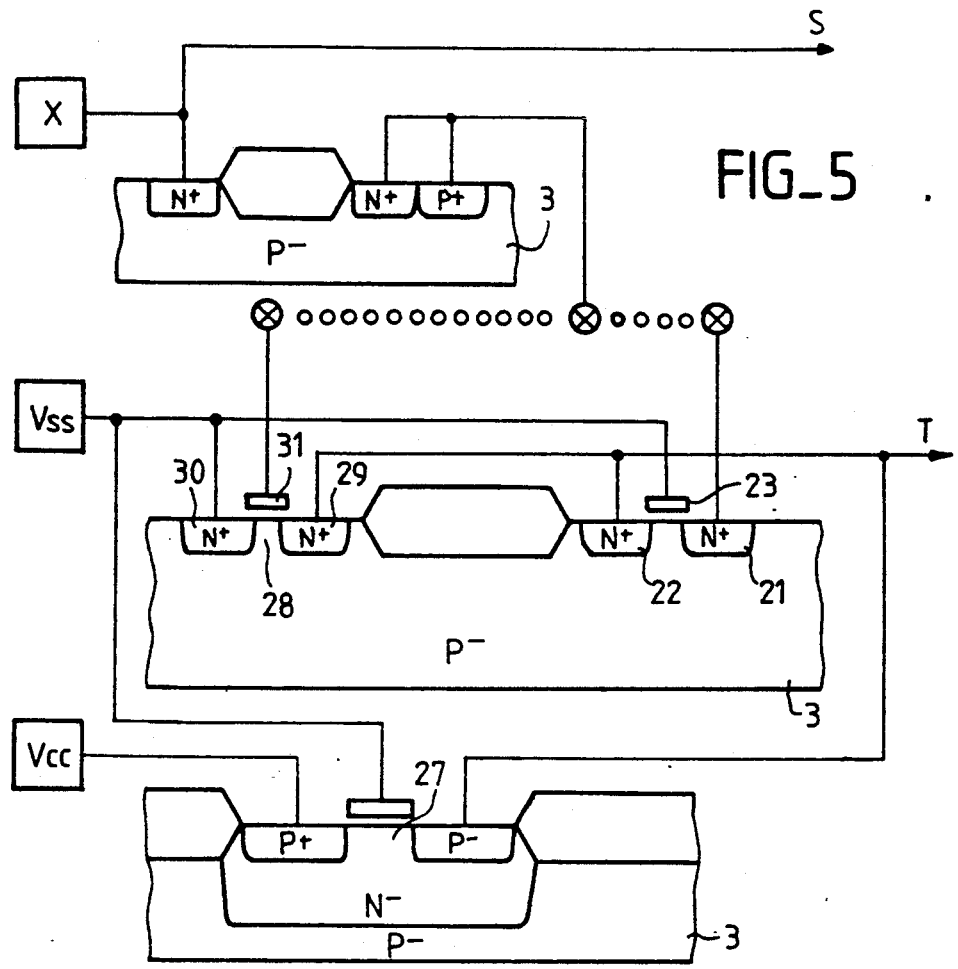
FIG_5
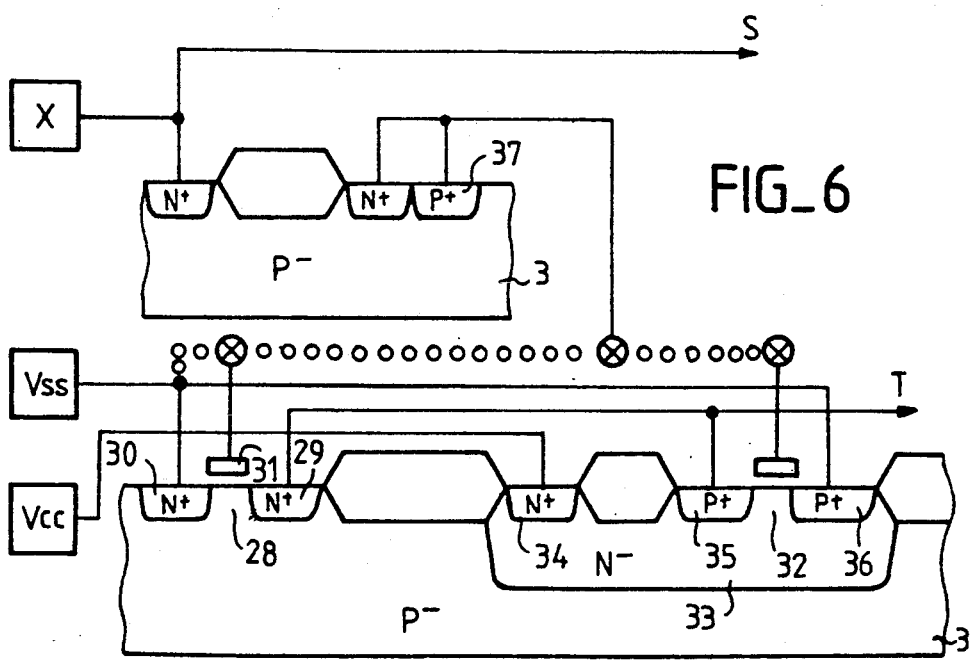
FIG_6

SAFETY DEVICE FOR INTEGRATED CIRCUIT

BACKGROUND OF THE INVENTION

1. Field of the Invention

An object of the present invention is a safety device for an integrated circuit. It is more particularly designed for the field of chip cards where it proves to be necessary to prevent fraudulent behaviour.

2. Description of the Prior Art

There already exist known protection systems of the electrostatic type, wherein protection circuits shield the integrated circuits against overvoltages. These overvoltages are, for example, caused when chip cards are used, through friction between the support of the chip cards and the reading machines, or between this support and the users' clothes. These protection systems are based on a simple principle. It includes interposing a semiconductor junction in parallel with each access terminal of the integrated circuit. This semiconductor junction is triggered for a pre-determined level of a voltage applied to this terminal with respect to another terminal (generally connected to the substrate). It has been observed, however, that in certain circumstances the substrate currents that result from making this junction conductive tend to modify the working of the integrated circuit.

Today, the greatest concern of circuit designers, especially for chip cards, is safety against possibly fraudulent individuals. This safety can be obtained in two ways. It can be obtained, on the one hand, through the software and, on the other, through the hardware (the circuits). No safety system is totally effective. Wired logic circuits (wherein there is no programming) are made safe solely by the hardware, while microprocessor circuits use both types of safety systems. In particular, in chip cards, both these types of safety systems are used. Consequently, there is always a hardware type of safety in the cards.

In the most elementary type of fraudulent activity with a card, the behavior of the circuit is modified by using only those terminals of the circuit that are accessible by a reader. This simple type of fraudulent behavior does not require many means. It is generally easy to implement. If the circuit is designed properly, there is no possibility of logic-type fraudulent behavior wherein abnormal logic signals are applied to the different terminals. But, on the other hand, there is nothing to prevent the fraudulent person from applying voltage levels, quite beyond the specifications of the circuit, to its terminals. These voltage levels could cause major substrate currents which themselves lead to programming or deprogramming operations that are harmful to the circuit.

In the integrated circuits, the terminals are all protected against electrostatic discharges. These systems of protection consist chiefly of diodes, bipolar transistors and resistors. They enable the removal of the charges present at the terminals once the voltage at this terminal has gone beyond a certain value. The charges to be removed are injected into the substrate of the circuit. They are then removed by a ground terminal to which this substrate is connected, at long intervals, by a ground connection. The electrostatic type of protection is aimed solely at preventing the junctions contained in the integrated circuit from being subjected to voltages that could lead them to breakdown. A situation is thus envisaged where a fraudulent individual could try to subject some of the connection terminals of the integrated circuit to overvoltages that make these electrostatic protection circuits operate. When these electrostatic protection circuits are in operation, high substrate currents develop in the substrate. These currents may possibly alter the logic behavior of the circuit. For, it can be shown that the substrate current may easily reach one ampere. Beyond one ampere, the wires connecting the integrated circuit to the support of the chip card that contains it melt, and the circuit becomes unusable. However, just below this value of one ampere, and with a resistance of one ohm between the terminal subjected to the overvoltage and the ground terminal, a drop in potential of one volt is obtained. In this case, the voltage of the substrate and of the ground connection rises locally to one volt with respect to the ground terminal itself. If the signal produced locally at this position of the circuit is transmitted to another part of the circuit, which would not be affected by this current, the theoretical input level of zero is considered to be carried to one volt and it may be detected as a logic 1. Such dysfunctioning in circuits has already been observed.

Furthermore an unwanted thyristor triggering phenomenon, called a "latch-up" phenomenon, may occur in CMOS type integrated circuit technologies. Latch-up problems such as this are commonly encountered when voltages, negative with respect to the potential imposed on the ground terminal, are injected into the connection terminals of the integrated circuit. This latch-up phenomenon may lead a circuit to work abnormally and, in certain cases, may even be difficult to detect. The result thereof is that, even without any fraudulent intent on the user's part, situations may be faced where dysfunctioning takes place.

SUMMARY OF THE INVENTION

It is an object of the invention to overcome these drawbacks by proposing an additional circuit to validate the operation of the integrated circuit. This additional validation circuit measures the difference in voltage or the current between a connection terminal of this circuit and positions of this circuit connected by a connection to this terminal. Naturally, this additional protection may be provided in the same way for all the terminals of the circuit. In the invention, therefore, with each electrostatic protection there is associated a circuit for detecting voltage level or current level anomalies at the associated ground terminal.

An object of the invention, therefore, is a safety device for integrated circuits comprising means to invalidate the operation of this circuit as a function of the current that flows between a connection terminal of the substrate of this circuit and positions of the substrate of this circuit connected by a connection to this terminal.

BRIEF DESCRIPTION OF THE DRAWINGS

The invention will be understood more clearly from the following description and from the accompanying figures. These figures are given purely by way of indication and in no way restrict the scope of the invention. Of these figures:

FIG. 1 is a schematic diagram of a safety device according to the invention;

FIG. 2 is a sectional drawing showing a schematic view of the implantation of the device of FIG. 1 in an integrated circuit;

FIGS. 3 and 4 show preferred variants of the device of the invention with field-effect transistors;

FIGS. 5 and 6 are drawings of implantation of integrated circuits corresponding respectively to the preceding FIGS. 3 and 4.

DESCRIPTION OF PREFERRED EMBODIMENTS

FIG. 1 gives a view, in a partially shown integrated circuit 1, of a safety device according to the invention. This safety device is designed to be fitted to the integrated circuit. This integrated circuit has access terminals. Three of them are shown: one indeterminate terminal for a logic access X, one DC voltage supply terminal VCC and a ground connection terminal VSS. These three terminals are designed to be subjected to potentials by external means so as to make the integrated circuit work. While the bias voltages are transmitted to the terminals VSS and VCC, logic signals are transmitted by the terminal X and end in the integrated circuit 1 in a signal S which is processed therein. In the invention, there is provision for a signal V to validate the functioning of the integrated circuit. To make things clearer, this validation signal could be a clock signal H, the transmission of which is done, by means of an AND gate 2 for example, if a test signal T is present. The signal T is present if it has been ascertained that there is no notable potential difference or current difference between the ground terminal VSS, normally connected to the substrate, and positions of the substrate of this circuit connected by a connection to this terminal. This connection is noted in FIG. 1 by small circles. This connection is not an equipotential connection because it takes into account the fact that if an excessively high current flows through it, it is the location of a drop in voltage such that the potential is different at all its points.

The terminal X is normally protected, in a known way, from electrostatic overvoltages by the presence of a transistor $T_1$ and two diodes $D_1$ and $D_2$ placed in parallel on the transmission channel of the signal S. If it is assumed that an excessively high voltage is applied to the terminal X, the emitter of the short-circuited transistor $T_1$ is carried not to the potential applied to the terminal VSS but, owing to the drop in voltage due to the discharge current but to a potential that is slightly higher. This slightly higher potential may be transferred into two parts that neighbour this circuit $T_1$, namely $D_1$ $D_2$, in the circuit 1. Therein, it may provoke the triggering, in these neighbouring parts, of pulses that produce a harmful programming of the circuit 1.

FIG. 2, repeating the same elements and the same numbering, gives a schematic view of the implantation of the transistor $T_1$ and of the diodes $D_1$ and $D_2$. An N+ doped region 4 is made in a P− type semiconductor substrate 3. The region 4, with the substrate 3, at the position 6 of its connection to the terminal X, constitutes a diode D1. The region 4 is elongated so that it has a resistance R between the position of this connection and the position of a connector 5 where the signal S is provided. Opposite the connection 6 with respect to a thick oxide zone 7, there is another region 8 which is also N+ doped. The region 8, with the region 4 at the position of the connection 6, forms the transistor $T_1$. This region 8 is connected by a connection 9 to a substrate voltage connector 10. The substrate voltage connector is connected to the substrate bias terminal VSS.

When a too high potential is applied to the terminal X, the diodes $D_1$ and $D_2$ and the transistor $T_1$ are triggered. There is a very high current that flows into the substrate 3. The substrate 3, vertical to the oxide region 7, may be considered to form the base of the transistor $T_1$, the emitter of which is the region 8. This triggering of the transistor gets propagated in devices that are of the same type and are relatively close to the triggered transistor $T_1$. The proximity of this triggering is of the order of 400 micrometers.

Since this phenomenon is in the vicinity of $T_1$, another transistor, namely a transistor $T_2$, will become conductive, and its becoming conductive will be used as a signal marking the presence of an abnormal phenomenon. Hence, in the vicinity of the terminal X and of these known electrostatic protection circuits $T_1$, $D_1$, $D_2$, a transistor $T_2$ will be placed. This transistor $T_2$ is also a bipolar type transistor. It has an emitter formed by an N+ doped region 11 electrically connected to the terminal VSS. It has a collector formed by the part 12 of a region 13 which is also N+ doped. The region 13 is long enough to develop a conduction resistance $R_1$ between its part 12 and another part 14. The end 14 of the region 13 is connected to the terminal X. When the bipolar transistor $T_1$ gets triggered, the bipolar transistor $T_2$ formed by the regions 11 and 12 also gets triggered so that the distance $R_1$ is now the location of a significant drop in voltage.

Another polar transistor $T_3$, of a PNP type, is made in a well 15. It is connected by its emitter 16, formed by a P+ doped region in the N− doped well to the terminal X. It is connected by an end 17 of its collector region to an output of the signal DETH. The collector region is fairly long and has another end 18 enabling a conduction resistance $R_2$ to be developed. The end 18 is electrically connected to the terminal VSS. The transistor $T_3$ works as follows. When a current flows through the resistor $R_1$, it is the location of a drop in voltage. This drop in voltage can be used to cause the triggering of the transistor $T_3$ which makes a current flow into the resistor $R_2$. As a consequence, the voltage available at the end 17, or else the signal DETH, goes from VSS to a voltage related to the value of $R_2$ and to the current that flows through $R_2$. To trigger the transistor $T_3$, an N+ doped region 19, which acts as a pad connector and is electrically connected to the collector 12 of the transistor $T_2$, is added into the pad 15. The transistor $T_3$ herein only relays the current detection made at the position of the transistor $T_2$. This relay or sensor may be quite different: notably, the circuit of $T_3$ may be replaced by a circuit of N or P type MOS transistors.

A connection, represented by dashes, shows the influence of the pad current thus imposed to trigger the transistor $T_3$. It will be noted that this type of operation is promoted by the presence of thick oxide regions 7, 20 which separate the matter and the collector of the transistors $T_1$ and $T_2$ respectively. For, before achieving this thick oxidation, it is possible to implant P type impurities to locally increase the concentration and to convert it from P− to P+. This increases the gain of the concerned bipolar transistor.

It will be noted that, in FIG. 1, the bases of the transistors $T_1$ and $T_2$ are connected to the terminal VSS only through a resistor RVSS marked by a link shown with small circles. The circuit of the invention thus indeed enables the measurement of the current that flows between the ground connection terminal VSS of the substrate of the integrated circuit and internal positions of the substrate of this circuit which are connected by a connection RVSS to this ground connection terminal. For, these positions are vertical to the thick oxide regions 7 and 20. They are connected by means of the substrate connector 10 to the connection VSS.

As regards the negative high voltages, preferably a field-effect transistor, rather than a bipolar type of transistor, will be used to detect them. To this end (FIG. 2), an N type field-effect transistor is made by implanting two N+ doped regions 21, 22 in the P-substrate 3 of the integrated circuit. A gate 23, made of polysilicon on top of a gate oxide, enables the control of the conduction channel of this field-effect transistor. The gate 23 and the source 21 are connected to the terminal VSS, the drain 22, biased by a biasing circuit seen further below, gives out a signal DETL reporting the presence of a fault by its change of state.

The specific feature of connection of the region 21 and of the gate 23 is that they are not connected to the terminal VSS in the same way. The gate 23 is connected directly by a metallization 24 to the terminal VSS. Since the gate of a field-effect transistor delivers no current, it can be assumed that the gate 23 will be permanently carried to the potential VSS. On the other hand, the source region 21 is connected to VSS in another way. For, the voltage VSS distribution connection is connected, from place to place, to substrate connections such as 25 and 26. As has been seen earlier, at certain places, the substrate, owing to the discharge of the electrostatic protection transistor $T_1$, may be locally connected to a potential that is different from VSS. It is to this different potential that the region 21 is connected. Ultimately, as soon as a problem of difference in voltage appears in the substrate (owing to the current that flows through this substrate), it induces a difference in potential such that the field-effect transistor 21-23 becomes conductive and the signal DETL goes to zero.

The bias circuit of the detector formed by the field-effect transistor 21-23 essentially includes a resistor. This resistor, in one example, is formed by an N channel transistor 27, the drain of which is connected to VCC, the gate of which is connected to VSS and the source of which is connected to the drain 22 of the transistor 21-23. This circuit enables the detection of the negative currents in the substrate.

So as to validate the working of the integrated circuit, the signal DETH goes into an inverter to become the signal HTED. The signal DETL and the signal HTED are transmitted together to a NAND gate delivering a signal T for the validation of the working of the clock H. The validation circuit shown here may naturally take any other form and may notably include an alarm circuit enabling the user to be warned about a latch-up phenomenon.

In keeping the same references, notably as regards the resistive connection, FIGS. 3 and 4 show preferred variants with field-effect transistors as detectors instead of bipolar transistors. The circuits of these figures are simpler since they now have only the standard MOS transistor (apart from the bipolar transistor $T_1$ external to the circuit). The circuit of FIG. 3, for which the drawing of its implantation in the integrated circuit is shown in FIG. 5, includes the protection circuit, against electrostatic discharges, formed by $T_1$, $D_1$, $D_2$ and R, the biasing transistor 27 and the MOS transistor 21-23. It further has another MOS transistor 28, of an N type, with a first N+ doped region 29 in the P− substrate 3. This region 29 is connected to the region 22 of the transistor 21-23. This region 29 is carried to a voltage representing a signal T. It also has another region 30, which is also N+ doped, directly connected to the terminal VSS. The two regions 29 and 30 are separated by a conduction channel surmounted by a control gate 31. The gate 31 is connected to the terminal VSS, but this connection is in the vicinity of a substrate connector that has had to undergo phenomena of triggering of the transistors of the electrostatic protection circuit. It can be shown that, at this position, if the drop in voltage of this connection, at the terminal VSS, is greater than 0.7 V, the signal T goes to zero.

In practice, the signal T reaches a connection common to a set of protective devices of the same type. For excessively high discharge currents, the detection signal may even become smaller than zero in certain cases. It could be that it triggers a small leak at the other terminals. This is not inconvenient since the integrated circuit is invalid at this instant and since, ultimately, the programming is prohibited. If it were desired, nonetheless, to prevent these leaks, the circuit of FIGS. 4 and 6 could be used instead of the circuit of FIGS. 3 and 5. In these FIGS. 4 and 6, the transistor 21-23 is replaced by a P type transistor 32 mounted in an N− doped well 33. The well 33 is connected by an N+ doped pad connector 34 to the terminal VCC. The transistor 32 has a first region 35 connected to the region 29 of the transistor 28 and delivering the signal T. It also has a second region 36 directly connected to the terminal VSS. The connection to the terminal VSS is direct. In this case, as in the preceding case, the gates of the two transistors 28 and 32 are connected to the terminal VSS by means of the common substrate connection which, at long intervals, plunges into this substrate 3 by substrate connectors 37, and is subjected with it to voltage drops.

What is claimed is:

1. A safety device for an integrated circuit on a substrate comprising means for detecting a current flowing in said substrate between a connection terminal on the substrate of this circuit and a position in the substrate, said detecting means having at least one drain region or source region or gate region of a transistor which is connected to said position through said substrate, and means for invalidating an operation of the integrated circuit as a function of a predetermined detection by said detection means.

2. A device according to claim 1, wherein said detecting means includes a bipolar transistor having emitter and collector regions located, on said substrate, on sides of a base region, said base region being formed by a part of the substrate at a location where said substrate is subjected to a substrate current, said bipolar transistor being connected by one of its regions to said detection means for noting when said bipolar transistor is made conductive.

3. A device according to claim 1, wherein the detecting means includes a field-effect transistor having a gate connected to the position in the substrate of the integrated circuit, and having drain and source regions, one of which being connected to the connection terminal, and of which the other region, the source or drain region respectively, is connected to said detection means by a sensor, means for noting when the field-effect transistor is made conductive.

4. A device according to claim 1, wherein the detecting means comprises a field-effect transistor, having a drain or source region connected to connection terminal of the integrated circuit, a gate of said transistor being connected to said position, and of which the other region, the drain or source region respectively, is connected to a detector to detect when this field-effect transistor is made conductive.

5. A device according to claim 1 wherein paid detecting means and paid invalidating means are within 400 micrometers of each other.

* * * * *